thickness of 0.014 inches is carefully etched in "white etch" (3 parts HF: one part $HNO_3$), washed in distilled water, and heated in a reaction chamber in an atmosphere of dry oxygen at a temperature of 1,000° C. for 3 hours to form a film 1,200 A.U. in thickness of silicon dioxide thereover. The wafer is annealed in helium at 1,000° C. for 3 hours. The wafer is then heated to a temperature of 400° C. while a 5,000 A.U. thick film of molybdenum is deposited thereon in a triode glow discharge with a molybdenum target in 0.015 torr of argon for 20 minutes. A film of KPR photoresist is coated upon the surface of the molybdenum film and a mask having apertures therein corresponding to concentric source and drain regions is superposed over the wafer and the photoresist is irradiated therethrough. After irradiation the wafer is immersed in photoresist developer, which removes the unirradiated portions of the photoresist, and leaves the concentric pattern of the irradiated portions thereon. The wafer is washed in distilled water and then immersed in a ferricyanide etch for 1 minute to cause the removal of the molybdenum exposed through the photoresist pattern. After removing from the etchant and washing in distilled water, the wafer is scrubbed in trichloroethylene to remove the photoresist and placed in an oxide deposition chamber. A 1,000 A.U. thick layer of 1 percent phosphorus-doped silicon dioxide is next formed on the wafer by passing the combined flow of a 7 cubic feet per hour flow of dry argon, which has been bubbled through ethyl orthosilicate and a 0.7 cubic feet per hour flow of dry argon bubbled through triethyl phosphate over the wafer while it is heated to a temperature of 800° C. for 3 minutes. The coated wafer is then heated to a temperature of 1,100° C. for 15 hours in an atmosphere of argon and $CO_2$ to cause the phosphorus in the phosphorus-doped $SiO_2$ film to diffuse into surface-adjacent portions of the silicon wafer forming source and drain regions. A 3,000 A.U. undoped film of silicon dioxide is formed over the diffused wafer by passage of an argon vapor saturated with ethyl orthosilicate obtained by bubbling dry argon through ethyl orthosilicate and passing the same over the wafer at a rate of 7 cubic feet per hour while the wafer is heated to a temperature of 800° C. After 15 minutes of this process, the undoped silicon-dioxide film is formed.

A photoresist layer is next coated over the wafer and the wafer is optically masked so as to cover electrode-contact regions in registry with, but substantially smaller than, the source and drain apertures in the molybdenum pattern and the gate electrode. After irradiation and developing in photoresist developer, a pattern of apertures corresponding to restricted portions of source and drain regions and gate electrode is formed in the photoresist. The wafer is immersed in buffered HF etching solution for four minutes to dissolve away the silicon dioxide down to the source and drain regions and gate-electrode portion of the molybdenum thereover forming restricted dimension source, drain, and gate contact apertures. The entire surface of the wafer is next metallized by vacuum evaporation of aluminum thereover for 1 minute and a photoresist layer containing apertures therein corresponding to source, drain, and gate electrodes is formed therein. The resultant masked wafer is immersed in an orthophosphoric acid etch for 1 minute, removing all the aluminum except the electrode contacts. Electrical connection is made to the base region by alloying the opposite major surface of the wafer to a header utilizing an indium-doped gold alloy. Individual FET devices are separated by dicing the wafer into modules. The wafer is heated in hydrogen at 570° C. for 1 minute and annealed at 400° C. for 3 hours in hydrogen. Electrical contacts are made to the source and drain regions and the gate electrode by connecting to the remaining portions of the aluminized film by thermocompression bonding.

EXAMPLE II

A P-channel, enhancement mode, field-effect transistor, as illustrated in FIG. 2 of the drawing, is formed as in the preceding paragraph except that an N-type silicon wafer having a concentration of $5\times10^{15}$ atoms of phosphorus per cubic centimeter is utilized as the starting material and the doped silicon-dioxide film is formed by substituting triethyl borate for the triethyl phosphate for the preceding example. Other process steps are substantially identical and the resultant structure is a P-channel device on an N-type silicon wafer.

EXAMPLE III

An N-channel, enhancement mode, field-effect transistor device is formed upon an N-type wafer substantially as follows. A 1-inch diameter 0.014 inch thick wafer of monocrystalline silicon having an impurity concentration of $10^{15}$ atoms per cubic centimeter of phosphorus and a (1, 0, 0) major surface is etched and washed as in Example 1 and placed in a reaction chamber and heated to 1,000° C. for 3 hours in a dry oxygen atmosphere to form a 1,200 A.U. thick film of silicon dioxide. The same film is then heated to 400° C. in a triode sputtering glow discharge for 15 minutes to form a 3,000 A.U. film of molybdenum thereon.

The molybdenum-coated film is coated with a photoresist compound as in the previous examples and irradiated to form a pattern therein. After developing of the photoresist pattern and heating to harden the pattern, the wafer is immersed in a potassium-ferricyanide etch for 1 minute to pattern the molybdenum film in a concentric pattern corresponding to a circular drain and an annular gate region with apertures corresponding thereto. The patterned wafer is coated with a pyrolytically deposited, 1,000 A.U. thick film of boron-doped silicon dioxide by pyrolysis of ethyl orthosilicate and triethyl borate. After the doped oxide is formed the wafer is heated to a temperature of 1,100° C. for 20 hours to cause the boron in the deposited film to diffuse through the oxide coating and the molybdenum to modify the entire surface-adjacent region of the silicon wafer to P-type conductivity to a depth of approximately 10 microns. The wafer is etched for 1 minute in buffered HF to remove the boron-doped oxide film. A 1,000 A.U. thick film of phosphorus-doped $SiO_2$ is deposited over the wafer by the pyrolysis from a mixture of ethyl orthosilicate and triethyl phosphate as in the previous examples. The wafer is heated for 16 hours at a temperature of 1,100° C. to cause discrete source and drain regions to be diffused with phosphorus atoms to cause surface-adjacent source and drain regions to be diffused with phosphorus atoms to cause surface-adjacent source and drain regions to be converted to N-type conductivity. A 3,000 A.U. film of undoped $SiO_2$ is deposited over the wafer by pyrolysis from an argon atmosphere saturated with ethyl orthosilicate, as in the previous examples. The wafer is next patterned by a photoresist irradiation and developing step wherein discrete holes in the photoresist layer are made at regions corresponding to source, drain, and gate and a separate region corresponding to an exterior portion of the wafer. The remainder of the film is covered. After the formation of the photoresist pattern, the wafer is immersed in a buffered HF etchant for 5 minutes to remove silicon dioxide to the gate-electrode portion of the remaining molybdenum film, to the source and drain regions, and to the exterior portion of the molybdenum film through which contact to the base region is to be made. The wafer is removed and again masked with KPR, exposing only a portion of the base region contact area and immersed in a ferricyanide etch for 1 minute to remove that portion of the molybdenum film and again immersed in a buffered HF solution for 2 minutes to remove the oxide layer over the base region. The wafer is then metallized by evaporation of aluminum in vacuum for 30 seconds and the metallized wafer is covered with KPR at only regions corresponding to source, drain, and base-region contacts and gate-electrode contact. The covered wafer is immersed in the orthophosphoric acid etch, as before, for 1 minute to remove the unwanted aluminum, leaving only source, drain, gate, and base contacts. The wafer is heated and annealed and separated device portions thereof are separated and contacted as in Example I.

INVENTOR.
WOUTER ALBERS
JACOBUS VERBERKT

BY

AGENT

INVENTOR.
WOUTER ALBERS
JACOBUS VERBERKT
BY
[signature]
AGENT

SEMICONDUCTOR HETEROJUNCTION DEVICE

The invention relates to a semiconductor device comprising a semiconductor body having at least one junction between parts consisting of two different semiconductor compounds, and to methods of manufacturing the semiconductor device.

A junction between two different semiconductor materials in a semiconductor body is termed heterojunction as distinguished from a junction between differently doped parts of the same semiconductor materials. In semiconductor devices having such a heterojunction, for example, the difference in electrical and/or optical properties of the materials adjoining each other may advantageously be used for example, by a difference in band distance.

When using known semiconductor devices of the above-described type instabilities may occur, particularly at elevated temperature, which may be ascribed to contamination by diffusion of elements of one compound in the other, and conversely.

Moreover, the manufacture of known semiconductor devices of the above-described type is rather laborious. For example, first a crystal of one compound was prepared and then the other compound was provided on the crystal. The compounds were doped. The various circumstances in which the two compounds were made were associated with the difference in properties of the compounds. As a result of this, the temperature and the pressure during the preparation, as well as the apparatus in which the preparation was carried out, ought to be chosen differently for the two compounds. It often present problems to prevent undesirable contaminations, inter alia of one compound by elements or dopings of the other compound, and conversely.

One of the objects of the invention is to provide a semiconductor device which does not exhibit the above-mentioned drawbacks and can furthermore be manufactured in a simple manner.

The invention is based on the idea of using a junction between parts which at the temperatures of preparation and use can be in a thermodynamic equilibrium with one another so that no mutual contamination of the parts occurs.

According to the invention, a semiconductor device of the above-described type is characterized in that the semiconductor compounds consist of the same two elements, differ in their stoichiometric ratio of the elements, and can together form a thermodynamically stable system.

The semiconductor device according to the invention has the advantage that it can be manufactured in a small number of steps because crystals of the two compounds can be formed during one preparation step.

Since the two parts can be in a thermodynamic equilibrium with each other, the formation of irreversible changes by doping with elements of the compound on the other side of the heterojunction is avoided.

As a result of this, operating temperatures are admissible which lie above the limit at which diffusion can occur. As a result of this the possibility is opened of using comparatively high operating temperatures on the one hand, and it is not especially necessary to choose compounds of high melting points on the other hand.

A thermodynamically very stable system is realized in an embodiment of the semiconductor device according to the invention, in which the semiconductor compounds in the parts show deviations from their stoichiometric ratios, which deviations consist in that one compound has an excess of the element which the other compound contains relatively more and the other compound has an excess of the element which the one compound contains relatively more. The term "relatively" in this case relates to a mutual comparison of the two compounds.

The result of these deviations is that the junctions is a PN-junction. This phenomenon will be described in detail as the description progresses.

According to another embodiment of the semiconductor device according to the invention the semiconductor body comprises at least two of these junctions which extend parallel to each other. This may occur, for example, when at least the crystals of one compound are in the form of plates or laminations. The term parallel junctions should be understood here in a wide sense and comprises, for example, also junctions in semiconductor bodies of which at least the crystals of one compound are present in the form of parallel elongate prisms, wires or needles, so in general the axes of which extend parallel and which together constitute an oriented structure. The parallel junctions may be united to form larger junctions by mutual connection. This can take place, for example, at the surface of the semiconductor body by means of contact layers.

Crystals of the same compound may be connected together with a contact layer at right angles to the large surfaces of plate-shaped or lamination-shaped crystals or at right angles to the longitudinal direction of elongate crystals in the form of wires or needles in the semiconductor body when the contact layer forms an ohmic contact with crystals of one compound and is insulated from or makes a rectifying contact with crystals of the other compound. At another location on the semiconductor body a similar contact layer may be provided which makes a rectifying contact with or is insulated from crystals of one compound and forms an ohmic contact with crystals of the other compound. Contact layers with both rectifying or insulating and ohmic contacts belong, for example, to semiconductor devices with very long junctions as will be explained in detail below.

According to a preferred embodiment of the semiconductor device according to the invention the semiconductor body is bounded on at least one side by a contact layer which consists of one of the two compounds and connects the parts of the relative compound in the body together. On such a contact layer an electric contact is situated, for example, a metallic layer, for providing connection conductors. Moreover, the semiconductor body may be bounded on another side by a second contact layer which consists of the second compound and connects the parts of this compound in the body together.

Furthermore, electric contacts may be situated, for example, on the large surfaces of crystals which have the form of a plate or lamination. Such contacts are provided, for example, on the end faces of semiconductor bodies with many junctions. Semiconductor devices with such semiconductor bodies may be used, for example, as voltage limiters, as PNPN-of multilayer circuit elements, for example, symmetrical or asymmetrical thyristors, or as a semiconductor device having a negative resistance.

A particularly suitable method of manufacturing a semiconductor device according to the invention has been found to consist in that the semiconductor body is obtained in that a system which contains the two elements is cooled in an oriented manner and crystallized.

The system may consist, for example, of a gas, of a gas and a liquid, or of a gas and a solid. The compositions of the system naturally lies between the compositions of the two compounds. In oriented crystallization, crystallization is carried out in only one direction. Semiconductor bodies of semiconductor devices which are manufactured according to the above method often show parallel junctions. These junctions also extend parallel to the direction of crystallization. Theses crystals are in equilibrium with each other while generally they show deviations from the stoichiometric compositions. Said deviations are often such that one compound has an excess of the element which the other compound contains relatively more and the other compound has an excess of the element which the one compound contains relatively more.

If, upon crystallization, parallel junctions are formed, it can be observed at the solidification front, i.e., the interface at right angles to the direction of crystallization which separates the system and the crystallizing compounds, that the two compounds crystallize simultaneously.

However, this simultaneous crystallization does not always occur. It is possible that, for example, first one of the compounds crystallizes and then a mixture of crystals from the one compound and crystals from the other compound crystallize between the formed crystals while the junctions between the crystals in the mixture often do not extend parallel to the direction of crystallization.

This nonsimultaneous crystallization is avoided in a preferred embodiment of the method in which the ratio of the temperature gradient used for the oriented cooling to the crystallization rate is so large that the two semiconductor compounds are crystallized simultaneously from the system.

In this method, crystals of one compound and crystals of the other compound crystallize simultaneously beside each other at the solidification front.

The temperature gradient and the crystallization rate can be adjusted independently of each other. The temperature gradient is adjusted by means of a suitable source of heat and the crystallization rate is adjusted by the rate at which the system and the crystallizing compounds are moved relative to the source of heat. Generally, the crystallization rates are so small that the dissipation of the heat of solidification occurs so rapidly that the rate of crystallization is equal to the rate at which the system is moved. (The influence of the ratio of the temperature gradient and the crystallization rate on crystallization phenomena was already investigated. This was done inter alia by S. R. Mollard and M. C. Flemmings, Trans Met. Soc. A.I.M.E., Vol. 239, pp. 1534–1546, (1967) for the system tin lead).

In a further preferred embodiment of the method, the quantities of the elements in the system are chosen to be so that the minimum ratio of the temperature gradient to the crystallization rate at which the compounds are still crystallized simultaneously is substantially zero.

This means that, for example, upon cooling a melt, the quantities of the elements correspond approximately to the composition of the eutectic of the two compounds and, upon cooling a solid which decomposes peritectically in the semiconductor compound below a given temperature, that the quantities of the elements correspond approximately to the composition of the decomposing compound.

In this preferred embodiment the temperature gradient may be chosen to be small without it being necessary for the rate of crystallization to be small which in practice may be of great importance for the manufacture.

The average dimension of the crystals at right angles to the direction of crystallization depends upon the rate of crystallization and in general this dimension is smaller as the rate of crystallization is larger, and conversely.

Metallic contacts may be provided on surfaces of plate-shaped crystals in any conventional manner, for example, by means of a silver paste.

When a contact is provided, for example, on an acicular crystal or at right angles to a large surface of a plate-shaped crystal, the contact layer is preferably obtained in that a surface layer of the semiconductor body is converted in the contact layer the surface layer being, at elevated temperature but below the eutectic temperature, with vapor of a mixture of condensed phases which is in equilibrium at that temperature and consists of the two elements and contains of the two compounds only the compound of the parts which are connected, until the surface layer is fully converted in the contact layer, after which the contact layer is contacted at a similar temperature with vapor of a mixture of crystals of the two compounds until the contact layer has obtained the composition of the parts which are connected by the contact layer.

So the mixture of condensed phases has a composition which in the phase diagram of the elements with respect to the composition of the eutectic of the two compounds lies on the other side of the composition of the compound of the parts which are connected.

An electric contact may then be provided on the contact layer.

So the contact layer is provided by two thermal treatments in which the first converts a surface layer of the semiconductor body in one compound and the second gives the compound of the contact layer the correct equilibrium composition with the other compound.

The thermal treatments may be carried out in a closed vessel but the atmosphere around the semiconductor body may also be adjusted by embedding the semiconductor body to be heated in the relative mixtures prior to the thermal treatments.

Another possibility of connecting similar crystals may be used when the crystals which are converted show a reduction in volume during the first thermal treatment. Such a reduction in volume occurs, when, for example, by outdiffusion of an element, the new crystal has a smaller volume than the original crystal. The resulting holes or grooves in the surface may then be filled with an insulating material, after which the surface is covered with a metallic layer.

If contact layers are provided on oppositely located sides of the semiconductor body, they are preferably obtained in that a first surface layer of the semiconductor body is converted in a first contact layer from one compound which connects parts of the one compound, the first surface layer being contacted, at elevated temperature but below the eutectic temperature, with vapor of a mixture of condensed phases which at that temperature is in equilibrium and consists of the two elements and, of the two compounds, contains only the one compound, until the first surface layer is converted into the first contact layer, a second surface layer of the semiconductor body being converted into the second contact layer from the other compound which connects parts of the other compound, the second surface layer being contacted at a similar temperature with vapor of another mixture of condensed phases which is in equilibrium at that temperature and which consists of the two elements and, of the two compounds, contains only the other compound, until the second surface layer is converted into the second contact layer, the semiconductor body being then afterheated at a similar temperature until each of the contact layers has obtained the composition of the parts which are connected by the relative contact layer.

Instead of a separate second thermal treatment for each of the contact layers individually, the thermal treatments are combined in the present case. This is possible since the second thermal treatment is the same for both contact layers.

The combined thermal treatment may be carried out in a vapor which is formed by the semiconductor body itself. However, said vapor is preferably formed by using a separate batch of a mixture of crystals of the two compounds. Both compounds obtain their threshold compositions which are in equilibrium at the heating temperature.

In order that the invention may be readily carried into effect, it will now be described in greater detail, by way of example, with reference to the accompanying drawings, in which FIG. 1*a* shows a phase diagram of a two-component system in which the composition in atomic ratios of the two elements is plotted on the abscissa and the temperature is plotted on the ordinate.

FIG. 1*b* shows the diagram in which the composition shown in FIG. 1*a* is plotted along the abscissa and the associated partial vapor pressure of one of the elements at a given temperature is plotted along the ordinate.

Figure 1:
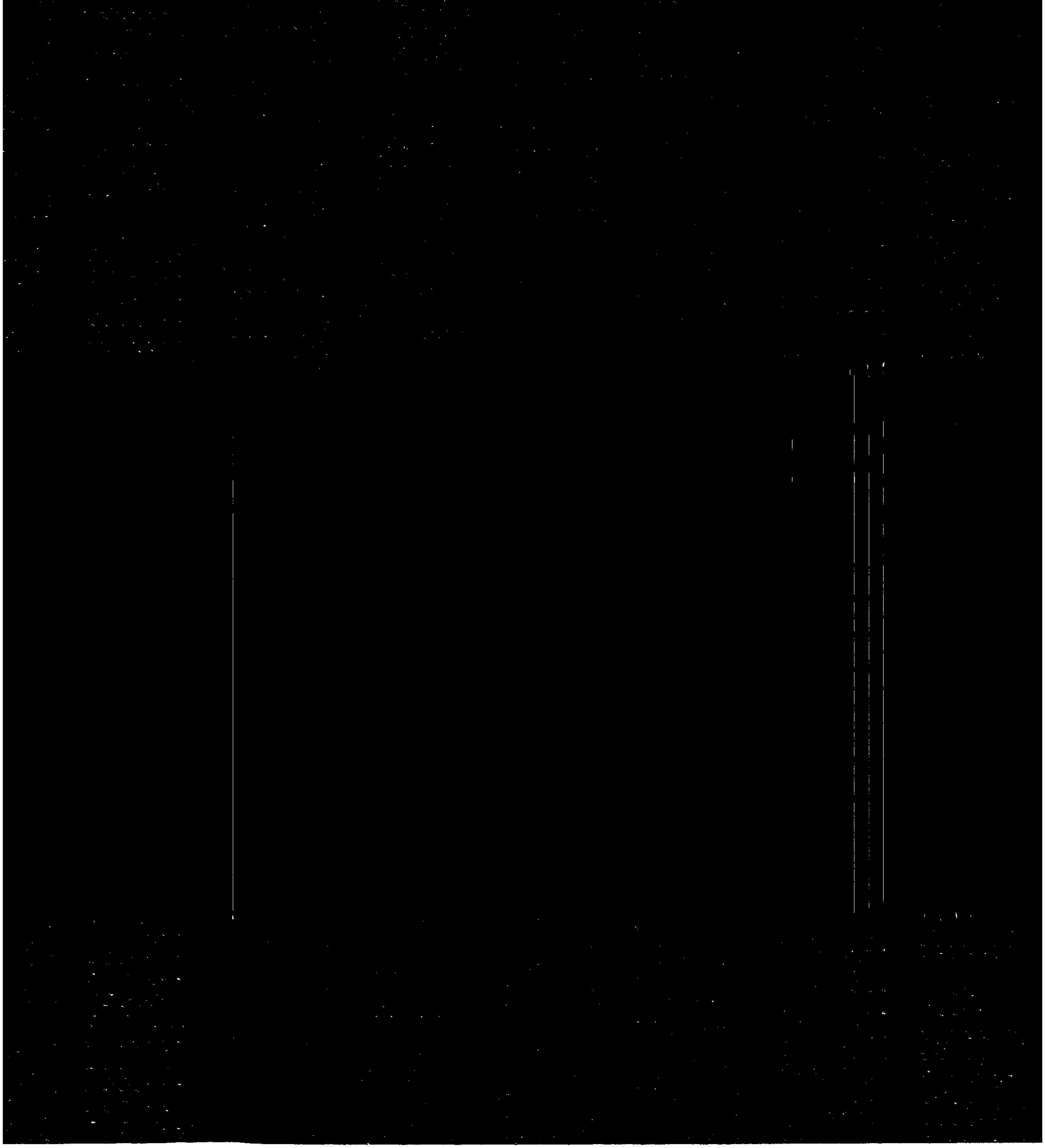

FIG. 1*a* shows a phase diagram of a system of two elements A and B between which two crystalline compounds AB and $AB_2$ can be formed. In the present case the compounds are congruently melting materials. The compound AB forms eutectic temperatures with the element A and the compound $AB_2$, which latter compound also forms an eutectic temperature with the element B.

The crystalline phases AB and $AB_2$ have thermodynamically stable existence regions at any temperature within which the content of the elements may vary. The width of said existence region depends upon the temperature and the relative compound. For example, at 600° C. the existence region of $Cu_2S$ is 3.2 at percent wide and of CdTe at, for example, 750° C. it is 0.0003 at percent.

The form of the existence range also depends upon the relative compound. This form often is asymmetrical and, with respect to the stoichiometric composition in a temperature range, it may even be located entirely on one side of that composition.

The threshold compositions of the compounds AB and $AB_2$, i.e., the most extreme compositions within which the compounds are still stable, in accordance with the temperature, are denoted by the lines 1 and 2 for the compound AB and by the lines 3 and 4 for the compound $AB_2$. At the temperature $T_1$ the composition of AB varies between the threshold compositions $x_3$ and $x_4$ and the composition of $AB_2$ between the threshold compositions $x_5$ and $x_7$.

In a mixture of crystals of AB and $AB_2$ which, at temperature $T_1$, are in equilibrium with each other, the crystals of AB have the composition $x_4$ and the crystals of $AB_2$ have the composition $x_5$.

For example, the compounds AB and $AB_2$ represent two different semiconductor compounds which form part of a semiconductor body of the semiconductor device according to the invention. Actually, the compounds differ in their stoichiometric ratio of the same two elements and they can together constitute a thermodynamically stable system.

Furthermore, in the case of equilibrium at, for example, temperature $T_1$, the compound AB shows an excess of the element B of which the compound $AB_2$ contains relatively more and the compound $AB_2$ shows an excess of the element A of which the compound AB contains relatively more.

Semiconductor compounds are generally composed of elements which differ in electronegativity. If the element B is more electronegative than the element A, addition of an excess of B to the crystals AB can make said crystals P-conductive and addition of an excess of A to the crystals $AB_2$ can made said crystals N-conductive.

The junctions between parts of the semiconductor body are in this case PN-junctions.

Figure 2:
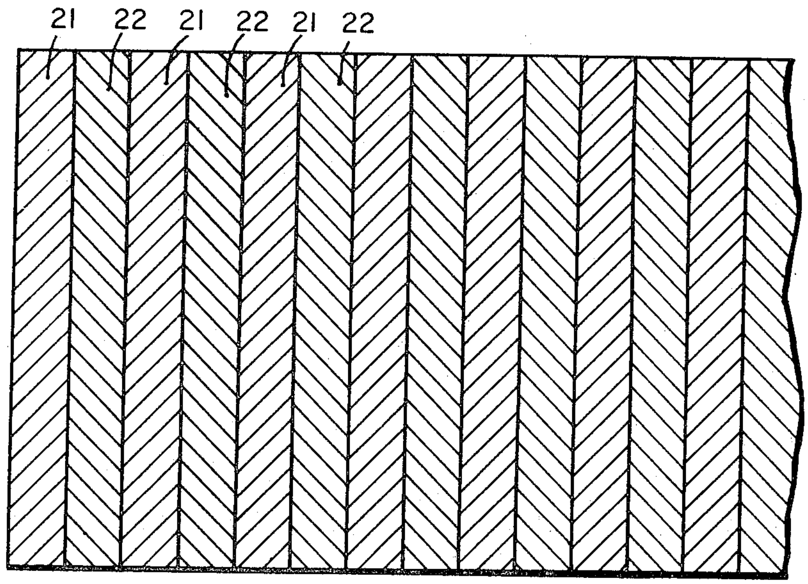
FIGS. 2, 3 and 4 are diagrammatic cross-sectional views of a part of a semiconductor device according to the invention in successive stages of manufacture.

Junctions are obtained, for example, when a system, for example, a melt with the eutectic composition $x_1$, is cooled and crystallized. Crystals of the compound AB and of the compound $AB_2$ adjoining each other are then simultaneously formed. These junctions will be parallel particularly when the cooling takes place in one direction. The junctions then are parallel to the direction of crystallization. A cross section of the semiconductor body then has the appearance as shown, for example, in FIG. 2. In this figure the crystals AB are denoted by 21 and the crystals $AB_2$ are denoted by 22.

The composition of the melt to be cooled in an oriented manner, however, need not be equal to the eutectic one. The composition of the melt may deviate from the eutectic composition but must lie between $x_8$ and $x_9$ which are the threshold compositions of AB and $AB_2$ which, at the eutectic temperature, are in equilibrium with one another.

If the composition of the melt lies between $x_8$ and $x_9$ and is, for example, $x_{10}$, a concentration gradient is adjusted in the stationary condition of the crystallization in the melt near the solidification front, for the concentration of, for example, the element B in this stationary condition in the melt is smaller than at the solidification front where it is about equal to that of the eutectic. This concentration gradient is proportional to the crystallization rate. This can be derived from considerations about diffusion of the element B in the melt but can be understood also qualitatively because upon increasing the rate of crystallization a larger quantity of the element B per unit of time must be conducted away from the solidification front which requires a larger concentration gradient. In addition to the concentration gradient there also is a temperature gradient in the melt. If the ratio of the temperature gradient and the concentration gradient is larger than the slope of the line CE in the point E, the compounds AB and $AB_2$ crystallize out simultaneously. However, if the ratio of the temperature gradient and the concentration gradient is smaller than the slope of the line CE in the point E, the compounds AB and $AB_2$ do not crystallize out simultaneously but first crystals from AB crystallize and then, between the first crystals, a mixture of crystals from both compounds crystallize, in which the junctions between the crystals in the mixture often do not extend parallel to the direction of crystallization.

The concentration gradient depends upon the concentration $x_{10}$ in the melt and, as already noted, is proportional to the rate of crystallization. With a given composition of the system the ratio of the temperature gradient in the melt and the rate of crystallization must hence exceed a minimum value in order that both compounds crystallize simultaneously.

FIG. 1*b* shows the vapor pressure of B in the gaseous phase for the associated compositions of the phases as shown in FIG. 1*a*.

In the regions with two solid phases, between $x_{11}$ and $x_3$, between $x_4$ and $x_5$, and between $x_7$ and $x_{12}$, the vapor pressure of B is independent of the composition at a given temperature.

Below $x_{11}$, between $x_3$ and $x_4$, between $x_5$ and $x_7$ and above $x_{12}$ where only one solid phase is present, the vapor pressure of B increases with $x$ at a given temperature.

Figure 3:
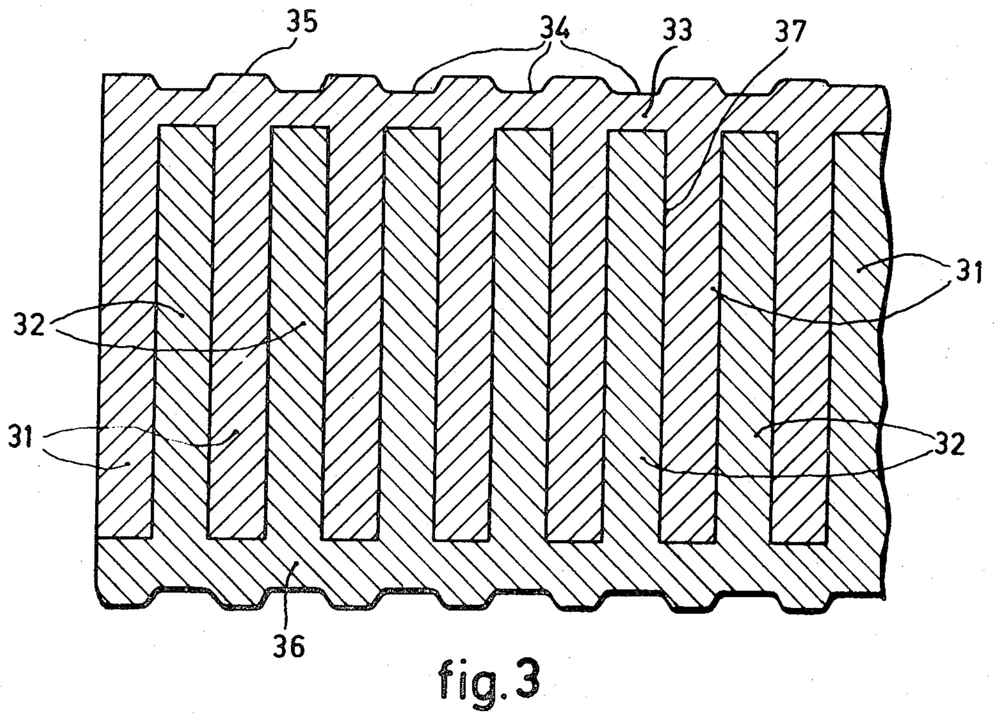

When the semiconductor body is to be provided with a contact layer which connects parts of the relative compound in the body together, the semiconductor body is heated, for example, at temperature $T_1$, in vapor of a mixture of the substances A and AB of the average composition $x_2$, which mixture is in equilibrium at $T_1$. Parts from AB in the crystal then assume the composition $x_3$ and hence experience no phase variation, but parts from $AB_2$ are converted into parts from AB having the composition $x_3$. The semiconductor body is then heated in vapor of a mixture of crystals of AB and $AB_2$ at a similar temperature which lies below the eutectic temperature $T_E$ but is high enough for adjusting the equilibrium in a practically suitable time. As a result of this a contact layer is formed from AB which connects the crystals from AB together and has the composition $x_4$. In FIG. 3, reference numerals 31 and 32 denote the crystals of the compound AB and the crystals of $AB_2$, respectively. By providing the contact layer 33, an end face at right angles to the direction of crystallization is fully converted into the compound AB. The surface 35 of the contact layer 33 shows recesses 34 at the area of the converted compound. Such recesses are formed, for example, by evaporation of an element as a result of which the new crystals have, for example, a smaller volume than the original crystals. Of course, dependent upon the system, thickenings may also be formed, for example, by condensation of an element during the conversion. Sometimes no variations in shape occur at all.

A second contact layer 36 can be provided analogously. The semiconductor body in this case is contacted at a temperature $<T_E$ with vapor of an equilibrium mixture having a composition $x_6$ and, after adjusting the equilibrium, it is contacted at a similar temperature with vapor of a mixture which consists of crystals of AB and $AB_2$ which are in equilibrium with each other at the said temperature.

The second thermal treatment of both contact layers separately is the same and may be combined.

In this method of contacting very long PN-junctions are formed as is denoted in FIG. 3 by 37.

The example to be described hereinafter relates to a semiconductor device comprising a semiconductor body having at least one PN-junction between parts consisting of SnSe and $SnSe_2$.

The starting material for the manufacture of a semiconductor body is a melt having approximately the composition of the eutectic of the compounds SnSe and $SnSe_2$. This composition lies at approximately 61 at percent Se. The eutectic temperature at conventional pressures is approximately 640° C. Upon cooling in an oriented manner a semiconductor body is formed from this melt having laminated crystals which consist of SnSe and $SnSe_2$.

Figure 5:
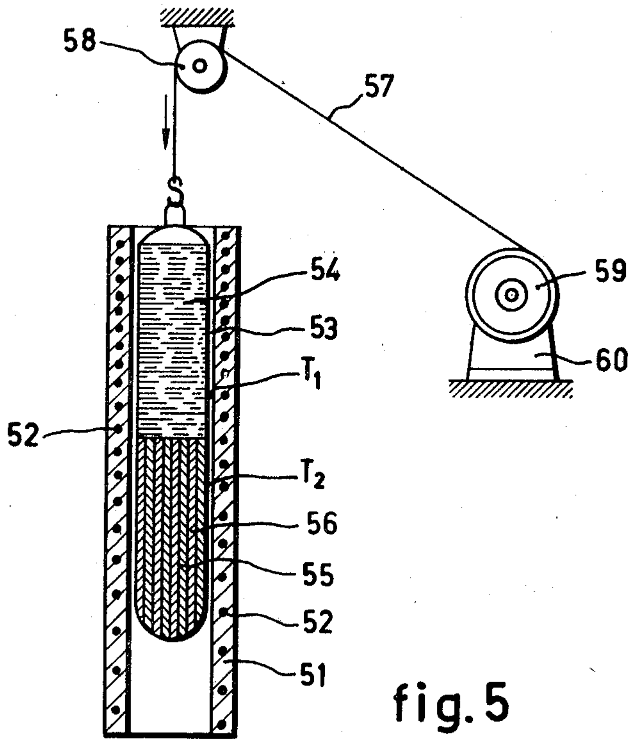
FIG. 5 is a diagrammatic cross-sectional view of a device for manufacturing a semiconductor body of a semiconductor device according to the invention.

The oriented cooling (see FIG. 5) is carried out in a vertical tube oven 51 by means of heater elements 52 in which a temperature gradient in the axial direction of 30° C./cm. is adjusted. A sealed quartz ampul 53 which is 10 cm. long and has an inside diameter of 1 cm. filled with a mixture consisting of the elements Sn and Se in a proportion which is equal to the composition of the eutectic of SnSe and $SnSe_2$, is heated in the over 51 at a temperature $T_1$ which lies above 640° C. After the contents of the quartz ampul 53 have melted to form the melt 54, the ampul is lowered through the over 51 at a rate of $10^{-4}$ cm./sec. during which lowering the contents of the ampul are gradually cooled under the influence of the temperature drop to a temperature $T_2$ which lies below 640° C., and crystallized. Lowering of the ampul 53 through the oven 51 is effected by means of a wire 57 which is connected to the ampul 53 and, through a pulley 58, to a winding device 59 which is mounted on the shaft of an electric motor 60.

The solidified body then consists of laminations of SnSe 56 and $SnSe_2$ 55 having an average diameter of approximately 3 $\mu$m. oriented in the direction of the axis of the body. At right angles to the axis of the body slices of approximately 1 mm. thickness are cut.

Contact layers are provided on the large faces of a slice. For that purpose one large side and the side edge of the slice is covered by providing an $SiO_2$ layer in a conventional manner, for example, by sputtering. The slice is then heated in a closed vessel for a few hours at a temperature of 500° C. in the presence of vapor of a mixture of phases which is in equilibrium at the heating temperature and consists of 73 at percent Sn and 27 at percent Se. The mixture at 500° C. consists of SnSe and of a liquid which is rich in tin and saturated with SnSe.

During this treatment the fact not covered with $SiO_2$ is converted into the compound SnSe having a threshold composition which in the phase diagram lies on the side of the Sn.

The $SiO_2$ layer is then removed in a conventional manner and the face already treated as well as the side edge is covered with a layer of $SiO_2$. The slice is then heated in a closed vessel for a few hours at a temperature of 500° C. in the presence of vapor of a mixture of phases which at the heating temperature is in equilibrium and consists of 15 at percent of Sn and 85 at percent of Se. At 500° C. the mixture consists of $SnSe_2$ and a liquid which is rich in selenium and is saturated with $SnSe_2$.

During this treatment the face not covered with $SiO_2$ is converted into the compound $SnSe_2$ having a threshold composition which in the phase diagram lies on the side of the Se.

Figure 4:
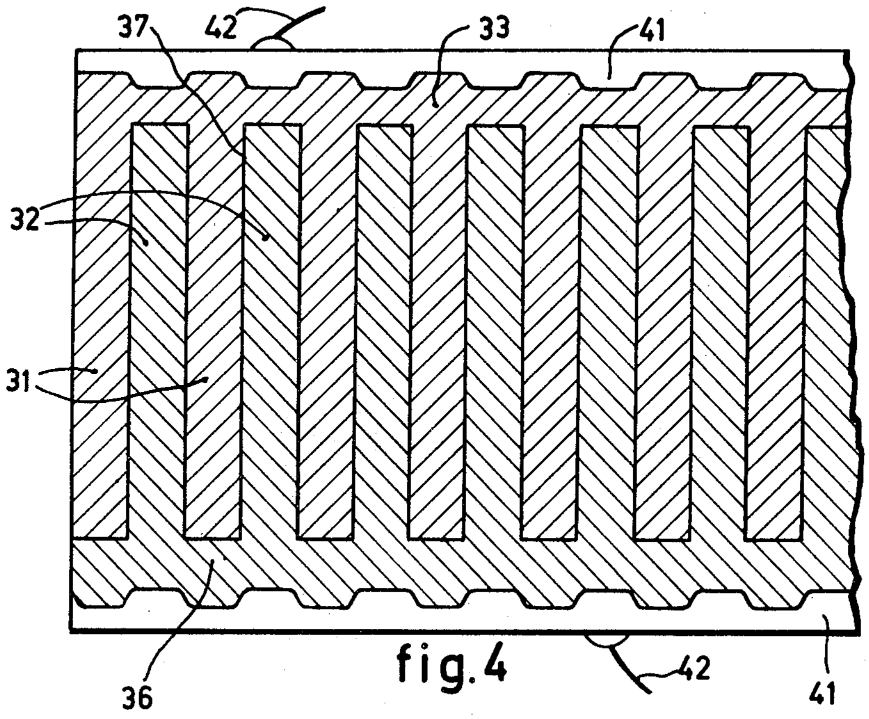

The $SiO_2$ layer is then removed and the slice is heated for a few hours at 500° C. in vapor of a mixture of crystals of SnSe and $SnSe_2$ which at that temperature are in equilibrium, the contact layers from SnSe and $SnSe_2$ obtaining the threshold compositions which correspond to the equilibrium between the two compounds. For SnSe this means that it has an excess of Se and for $SnSe_2$ it means that it has an excess of Sn. Metallic layers 41 consisting of silver are then provided in a conventional manner on the contact layers 33 and 36 (see FIG. 4), which layers 41 are provided with connection conductors 42. The resulting semiconductor device may then be further finished and, if desirable, provided with an envelope.

The invention is not restricted to the example described. For example, the tubular oven described in which the temperature gradient is adjusted may be replaced by another heat source. For example, the temperature gradient may be obtained by means of a laser or an electron beam which is focused on material of the required composition in the form of a dot or stripe, the desirable oriented microstructure being obtained on a microscale at very large temperature gradients via zone melting.

What is claimed is:

1. A semiconductor device comprising a semiconductor body having at least two parts consisting respectively of two different semiconductor compounds forming a heterojunction therebetween, said semiconductor compounds consisting of the same two elements differing respectively in their stoichiometric ratio of the elements and together forming said heterojunction thermodynamically stable with each of said parts substantially free of components migrated from the other.

2. A semiconductor device as claimed in claim 1 in which the semiconductor compounds in the respective parts comprise deviations from their stoichiometric ratios, said deviations consisting in one compound having an excess of the element which the other compound contains relatively more and the other compound having an excess of the element which the one compound contains relatively more.

3. A semiconductor device as claimed in claim 1 in which the semiconductor body comprises at least two heterojunctions which extend parallel to each other.

4. A semiconductor device as claimed in claim 1 in which the semiconductor body is bounded on at least one side by a contact layer which consists of one of the two compounds and connects the parts of the relative compound in the body together.

5. A semiconductor device as claimed in claim 1 wherein the elements are Sn and Se and the compounds consists of tin selenide (SnSe) and tin diselenide ($SnSe_2$).

* * * * *